United States Patent
Black

(10) Patent No.: US 7,542,258 B2
(45) Date of Patent: Jun. 2, 2009

(54) DV/DT-DETECTING OVERCURRENT PROTECTION CIRCUIT FOR POWER SUPPLY

(75) Inventor: Richard L. Black, Gilbertsville, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 555 days.

(21) Appl. No.: 10/759,690

(22) Filed: Jan. 16, 2004

(65) Prior Publication Data

US 2005/0157441 A1 Jul. 21, 2005

(51) Int. Cl.
*H02H 3/08* (2006.01)
*H02H 9/02* (2006.01)
*H03K 17/08* (2006.01)

(52) U.S. Cl. .................. 361/93.1; 327/381; 257/175
(58) Field of Classification Search ............... 361/93.1; 327/381; 257/157
See application file for complete search history.

(56) References Cited

U.S. PATENT DOCUMENTS

| | | | | |
|---|---|---|---|---|
| 3,727,148 A | * | 4/1973 | Carver | 330/298 |
| 3,854,779 A | * | 12/1974 | Skoyles et al. | 303/195 |
| 3,970,869 A | * | 7/1976 | Coats, Jr. | 327/374 |
| 4,365,171 A | * | 12/1982 | Archer | 327/478 |
| 5,751,052 A | * | 5/1998 | Heminger et al. | 257/577 |
| 5,818,281 A | * | 10/1998 | Ohura et al. | 327/381 |
| 6,285,235 B1 | * | 9/2001 | Ichikawa et al. | 327/374 |
| 6,630,805 B2 | * | 10/2003 | Makaran | 318/254 |
| 6,759,835 B2 | * | 7/2004 | Turvey et al. | 323/282 |

FOREIGN PATENT DOCUMENTS

| | | | |
|---|---|---|---|
| DE | 28 31 495 | * | 1/1980 |
| DE | 32 02 319 | | 7/1983 |
| DE | 3202319 | | 7/1983 |
| JP | 58-130726 | | 8/1983 |
| JP | 59-108423 | | 6/1984 |
| JP | 61-276425 | | 6/1986 |
| JP | 2002-315177 | | 10/2002 |

\* cited by examiner

*Primary Examiner*—Stephen W Jackson
*Assistant Examiner*—Zeev Kitov
(74) *Attorney, Agent, or Firm*—Ostrolenk, Faber, Gerb & Soffen, LLP

(57) ABSTRACT

An overcurrent protection circuit for a power switching transistor wherein the power switching transistor has a control electrode and two main electrodes, the circuit comprising a circuit including a protection switch for sensing the rate of change of voltage with respect to time at one of the main electrodes of the power switching transistor and for controlling the protection switch to remove a control signal to the control electrode of the power switching transistor to turn off the power switching transistor if the rate of change exceeds a predefined value.

14 Claims, 3 Drawing Sheets

DV/DT-DETECTING OVERCURRENT PROTECTION CIRCUIT FOR POWER SUPPLY

CROSS REFERENCE TO RELATED APPLICATION

The present application is related to U.S. application Ser. No. 10/458,608 filed Jun. 10, 2003 and entitled "HIGH EFFICENCY OFF-LINE LINEAR POWER SUPPLY", the entire disclosure of which is incorporated by reference herein.

BACKGROUND OF THE INVENTION

The present invention relates to an overcurrent protection circuit for electrical systems, such as power supplies, and in particular, an off-line high efficiency linear power supply.

In the above-identified U.S. patent application Ser. No. 10/458,608, a high efficiency off-line linear power supply is described. The power supply is designed to provide current to electronic circuits during a time period when a dimmer circuit for electric lamps is not drawing current. In particular, the power supply is designed to draw current for powering electronic circuits during time periods when the triac of the dimmer circuit is off.

With reference to FIG. 2, this figure shows an AC waveform (dashed line) along with a power supply current draw waveform (solid line). When the dimmer is off, the triac is off for the full length of the half-cycle. In this case, it is during the periods 1 and 3 that the power supply of the above-identified patent application provides power to a storage capacitor, which is subsequently regulated by a linear regulator. The power supply does not draw current during period 2. Because of the distinctive "cat-ear" regions 1 and 3 during which the power supply provides charging current to the storage capacitor, it is sometimes referred to as a "cat-ear" power supply. When the dimmer is set at full intensity or some intermediate level between 0% and 100%, the triac is off for some portion of each half-cycle and on for the other portion of the half cycle. Now, the power supply provides power to the storage capacitor only during period 1 and does not draw current during periods 2 and 3. In both cases above, the power supply draws current when the triac is off and there is voltage available across the triac to charge the storage capacitor. Since the dimmer will never be off all the time, the power supply preferably only draws current during period 1 in all cases.

With reference to FIG. 1, this figure shows a power supply similar to the high efficiency off-line linear power supply disclosed in the above-identified copending U.S. patent application. Power is applied from an alternating current source at the input I which is rectified by a diode D1 to provide a half-wave rectified voltage level on bus V+. Alternatively, a full-wave rectified voltage from a full-wave bridge can be provided to bus V+. A power switching transistor Q1 is provided in series with the bus. The source of the transistor Q1 is provided to an unregulated voltage bus capacitor C4. Regulator U1 supplies a regulated output voltage Vo.

The power supply includes a gate voltage supply including resistors R1, diode D2, capacitor C1, and zener diode Z1, which operate essentially the way as described in the above-identified copending patent application to provide a hard gate voltage turn-on for transistor Q1 via resistor R3, diode D3 and resistor R5. The voltage provided to the gate of transistor Q1 by this circuit provides a hard turn-on of transistor Q1, reducing the power loss in transistor Q1 when transistor Q1 is on.

Transistor Q2 turns off the transistor Q1 when the voltage level at its base, as defined by a voltage divider comprising resistors R1 and R2, reaches the threshold to turn on transistor Q2. This occurs when the bus voltage on bus V+ exceeds a predefined value, typically when the triac of the associated dimmer turns on and the bus V+ waveform is in region 2 of FIG. 2. Transistor Q2 can also be turned on when the voltage on capacitor C4 exceeds a predetermined value set by Z2. When transistor Q2 turns on, the gate drive is removed to transistor Q1 and transistor Q1 is turned off. When transistor Q2 turns off, for example, in region 3, transistor Q1 is switched back on.

The circuit of FIG. 1 includes an overcurrent protection circuit 100. That circuit includes a transistor Q3 and a resistor R6 of low resistance in series with the transistor Q1. The resistor R6 passes the full load current and accordingly, results in a power loss on the order of approximately 0.9 watt for current levels of approximately 3 amps. The overcurrent protection circuit 100 operates such that if the current level through transistor Q1 exceeds the predetermined value, transistor Q3 is turned on, thereby turning off the gate drive to the transistor Q1 and preventing damage to the transistor Q1.

Overcurrent protection circuit 100 of the power supply circuit of FIG. 1 wastes power in the series resistor R6 and contributes to an unnecessary voltage drop to the unregulated bus.

It is desirable to provide an overcurrent protection circuit that results in less power loss but still adequately protects the power switching transistor.

SUMMARY OF THE INVENTION

It is an object of the present invention to provide an improved overcurrent protection that which results in less power loss than the overcurrent protection circuit described above.

The above and other objects of the invention are achieved by an overcurrent protection circuit for a power switching transistor wherein the power switching transistor has a control electrode and two main electrodes, the circuit comprising:

A circuit including a protection switch for sensing the rate of change of voltage with respect to time at one of the main electrodes of the power switching transistor and for controlling the protection switch to remove a control signal to the control electrode of the power switching transistor to turn off the power switching transistor if the rate of change exceeds a predefined value.

Other objects, features and advantages of the present invention will become apparent from the detailed description which follows.

BRIEF DESCRIPTION OF THE DRAWING(S)

DETAILED DESCRIPTION OF THE INVENTION

Figure 3:
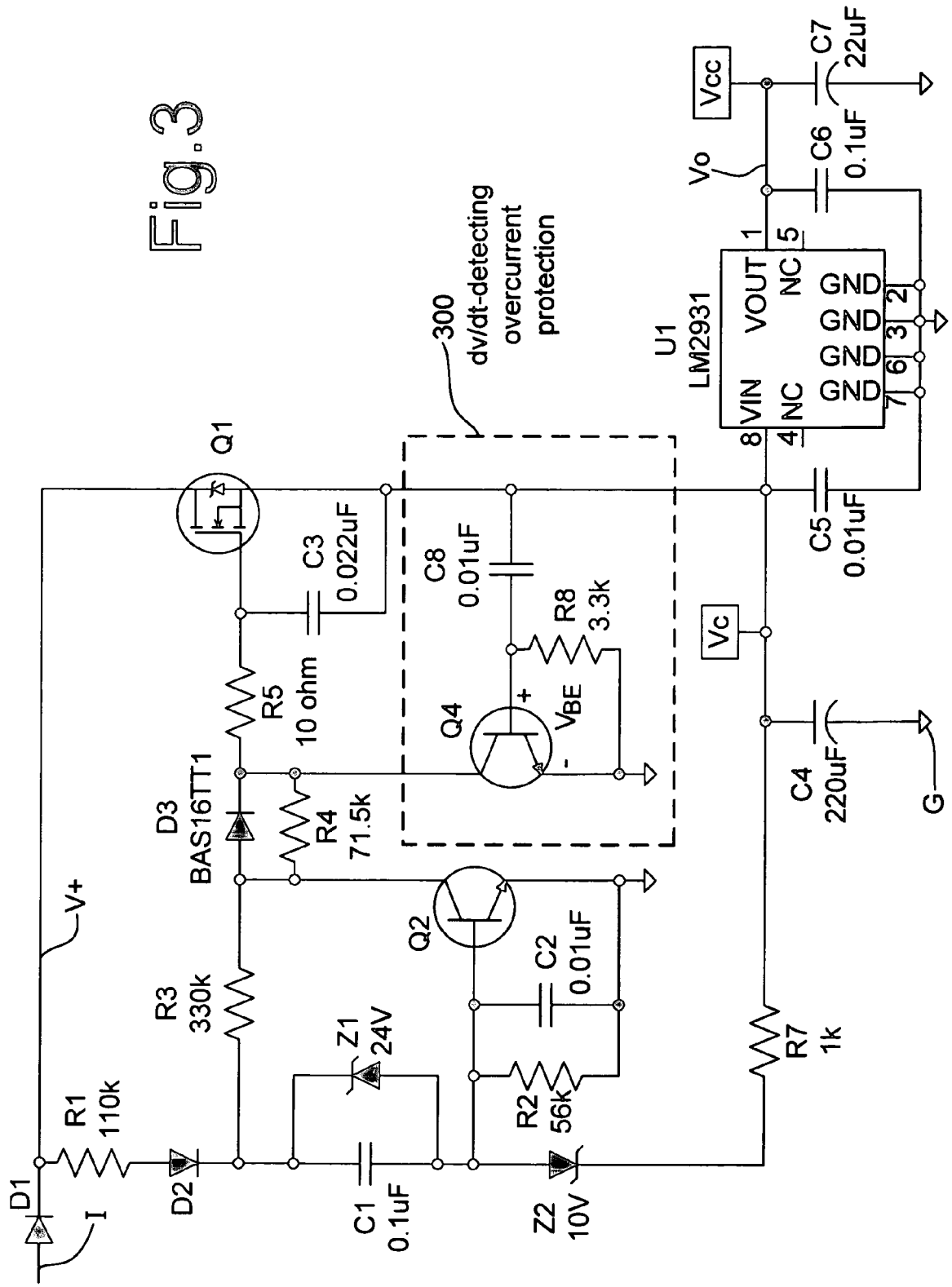
FIG. 3 shows a power supply incorporating the overcurrent protection circuit of the present invention.

With reference now to FIG. 3, a new overcurrent protection circuit 300 is provided according to the invention. The overcurrent protection circuit includes a transistor Q4, a capacitor C8 and a resistor R8. This circuit operates as follows. During normal operation, the voltage $V_{BE}$ between the base and emitter of transistor Q4 is less than about 0.3 volts corresponding to a maximum normal operating dV/dt at the source of transistor Q1, determined by the rise time of the ripple voltage on capacitor C4. This is insufficient to turn transistor Q4 on. The circuit is designed such that at approximately twice the normally developed dV/dt, the $V_{BE}$ of transistor Q4 is approximately 0.6 volts. This will be adequate to turn transistor Q4 on, thereby removing the gate drive from transistor Q1 and turning the power transistor Q1 off. Accordingly, when the dV/dt exceeds a predefined value, corresponding to an overcurrent, the base drive to transistor Q4 is adequate to turn it on.

If the current in transistor Q1 exceeds a predefined limit, the dV/dt or rate of change of the ripple voltage on capacitor C4 will be such that a pulse passed by capacitor C8 due to the dV/dt will cause a voltage drop across resistor R8 of approximately 0.6 volts thereby turning on transistor Q4. Under normal operating conditions, the dV/dt present on capacitor C4 will develop only approximately 0.3 volts across resistor R8, insufficient to turn transistor Q4 on.

Capacitor C8 must be reset for each cycle whether a half-wave or full-wave rectified voltage is provided on bus V+. The exemplary circuit uses a half-wave rectifier so the capacitor must be reset at the end of each full-wave of the AC cycle. Resistor R8 should normally be adequate to discharge capacitor C8 so that it will be ready to pass the next pulse during the next AC cycle. If resistor R8 is inadequate to discharge the capacitor, a diode can be provided between the base of transistor Q4 and ground polarized with its anode to ground to discharge the capacitor before the next cycle.

Figure 1:
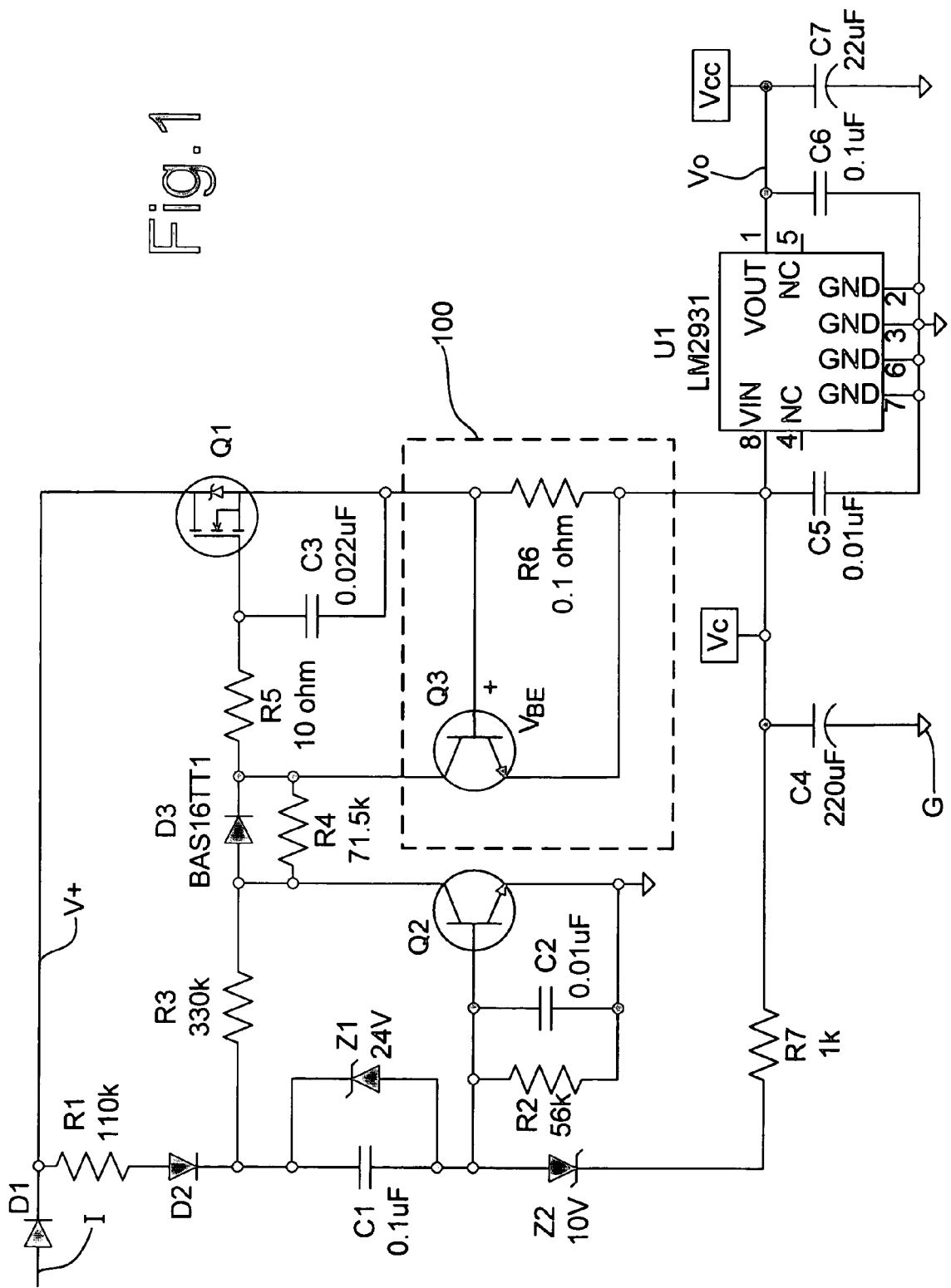
FIG. 1 shows a prior high efficiency off-line linear power supply circuit incorporating an overcurrent protection circuit.
Figure 2:
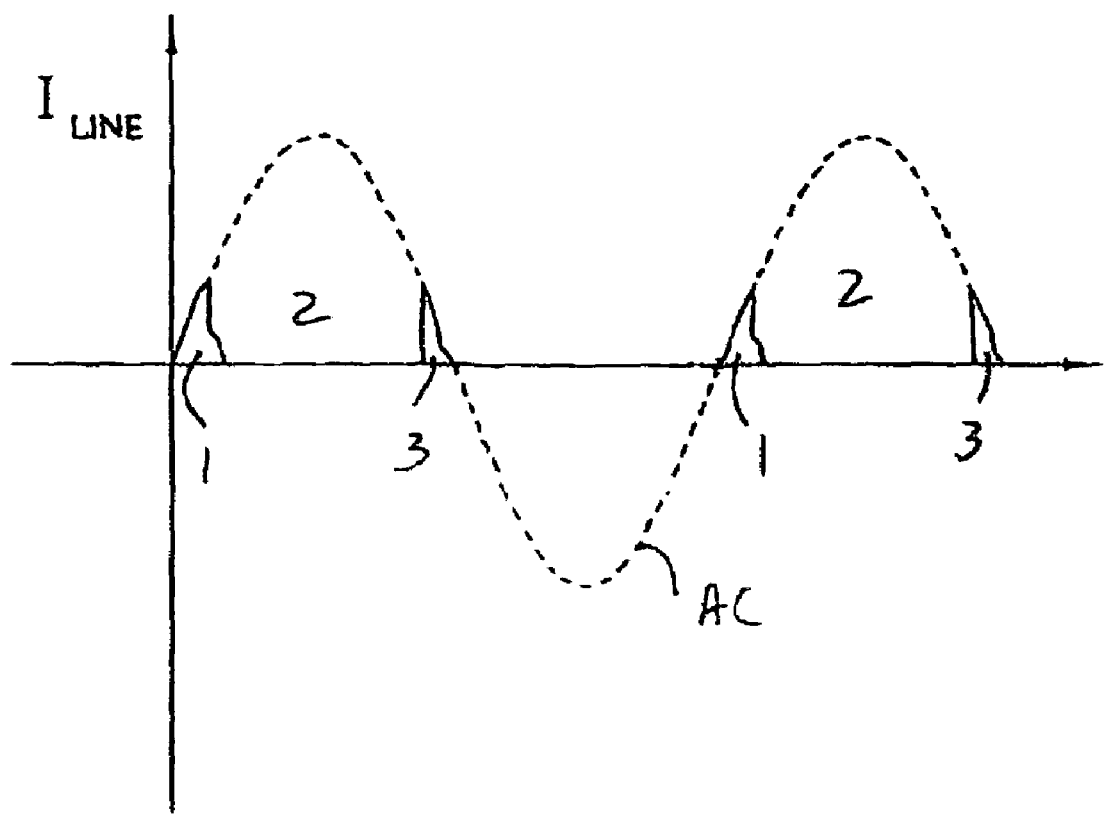
FIG. 2 shows waveforms for explaining the operation of the circuit of FIG. 1.

The dV/dt-detecting overcurrent protection circuit according to the invention provides benefits over the overcurrent protection circuit described with respect to FIG. 1. In particular, since there is no power dissipation in a series resistor such as the resistor R6 of FIG. 1, power consumption is reduced. At a current level of 3 amps, for example, power dissipation in resistor R6 is approximately 0.9 watts.

Further, since there is no series resistance element, there is no series element voltage drop, enabling a higher voltage to develop across capacitor C4 and thus conserving power. The power supply will charge more quickly and peak currents can be reduced resulting in less voltage drop across transistor Q1 and thus less power dissipation in transistor Q1.

According to an alternative embodiment of the invention, the transistor Q4 may be replaced by a field effect transistor.

In the circuit described, capacitor C8 is approximately 0.01 uF and resistor R8 is approximately 3.3 Kohms.

Although the overcurrent protection circuit of the invention has been shown in connection with protecting a power switching transistor of a power supply, the invention can be used in various circuits where the aim is to protect a power switching transistor or other electrical device from overcurrent damage. For example, the overcurrent protection circuit of the invention could be used to protect the triac of a dimmer if there is a short at the lighting load.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. An overcurrent protection circuit for a power switching transistor wherein the power switching transistor has a control electrode and first and second main electrodes, the first main electrode coupled to a first terminal of a storage capacitor, a second terminal of the storage capacitor coupled to a reference potential such that the storage capacitor is in series with the first and second main electrodes, the circuit comprising:
a sensing circuit, including a protection switch, for sensing the rate of change of voltage with respect to time across the storage capacitor wherein the rate of change of voltage is proportional to the magnitude of the current flowing through the power switching transistor, and for controlling the protection switch to remove a control signal to the control electrode of the power switching transistor to turn off the power switching transistor if the rate of change exceeds a first predefined value.

2. The circuit of claim 1, wherein the sensing circuit comprises a capacitor coupled to a main electrode of the power switching transistor, and a resistor coupled to receive a pulse of current from said capacitor, such that a voltage developed across the resistor turns on the protection switch if the voltage across the resistor exceeds a second predefined value.

3. The circuit of claim 2, wherein the protection switch comprises a transistor.

4. The circuit of claim 3, wherein the protection switch comprises a bipolar junction transistor.

5. The circuit of claim 4, wherein the resistor is coupled across the base-emitter junction of the protection transistor.

6. The circuit of claim 4, further comprising a diode coupled across the base-emitter junction of the protection transistor to discharge the capacitor.

7. The circuit of claim 3, wherein the protection switch comprises a field effect transistor (FET).

8. The circuit of claim 1, wherein the power switching transistor comprises a field effect transistor (FET).

9. An overcurrent protection circuit for a power switching transistor wherein the power switching transistor has a control electrode and first and second main electrodes, the first main electrode coupled to a storage capacitor coupled in series with the first and second main electrodes, the circuit comprising:
a protection transistor having a control electrode and first and second main electrodes, the first main electrode of the protection transistor coupled to the control electrode of the power switching transistor and the second main electrode of the protection transistor coupled to a reference potential;
a sensing capacitor having first and second terminals, the first terminal of the sensing capacitor coupled to the first main electrode of the power switching transistor and the storage capacitor, the sensing capacitor being adapted to generate a current representative of the rate of change of voltage with respect to time across the storage capacitor; and
a sensing resistor having first and second terminals, the first terminal of the sensing resistor coupled to the reference potential, and the second terminal of the sensing resistor coupled to both the control electrode of the protection transistor and the second terminal of the sensing capacitor, the sensing capacitor providing a current to the sensing resistor "to develop a sensing voltage across the sensing resistor representative of the rate of change of voltage across the storage capacitor to turn on the protection transistor if the sensing voltage across the sensing resistor exceeds a predefined sensing voltage value; wherein the protection transistor is adapted to remove a control signal to the control electrode of the power switching transistor to turn off the power switching transistor if the rate of change of voltage with respect to time across the storage capacitor exceeds a first predefined rate of change value".

10. The circuit of claim 9, wherein the protection transistor comprises a bipolar junction transistor.

11. The circuit of claim 10, wherein the resistor is coupled across the base-emitter junction of the protection transistor.

12. The circuit of claim 9, wherein the protection transistor comprises a field effect transistor (FET).

13. The circuit of claim 9, wherein the power switching transistor comprises a field effect transistor (FET).

14. A power supply comprising:
a power switching transistor having a control electrode and two main electrodes;
a storage capacitor coupled in series with the first and second main electrodes operable to draw current through the main electrodes of the power switching transistor when the power switching transistor is conductive; and
an overcurrent protection circuit operable to sense the rate of change of voltage with respect to time across the storage capacitor and comprising a protection transistor having a control electrode and first and second main terminals, the first main electrode of the protection transistor coupled to the control electrode of the power switching transistor, the protection transistor operable to remove a control signal to the control electrode of the power switching transistor to turn off the power switching transistor if the rate of change exceeds a predefined rate of change value;
wherein the storage capacitor is coupled between one of the main electrodes of the power switching transistor and a circuit common;

the overcurrent protection circuit further comprising:
a sensing capacitor having first and second terminals, the first terminal of the sensing capacitor coupled to the main electrode of the power switching transistor coupled to the storage capacitor, the sensing capacitor responsive to the rate of change of voltage with respect to time across the storage capacitor; and
a sensing resistor having first and second terminals, the first terminal of the sensing resistor coupled to the circuit common, and the second terminal of the sensing resistor coupled to both the control electrode of the protection transistor and the second terminal of the sensing capacitor, the sensing resistor adapted to develop a sensing voltage in response to the rate of change of voltage with respect to time across the storage capacitor;
wherein the sensing capacitor is operable to generate a current in response to the rate of change of voltage with respect to time across the storage capacitor, and the sensing resistor is operable to develop the sensing voltage in response to the current through the sensing capacitor;
wherein the second main electrode of the protection transistor is coupled to the circuit common and the protection transistor is adapted to turn off the power switching transistor if the sensing voltage across the sensing resistor exceeds a predefined voltage value.

* * * * *